United States Patent [19]
Chatterjee et al.

[11] Patent Number: 5,898,340
[45] Date of Patent: Apr. 27, 1999

[54] HIGH POWER EFFICIENCY AUDIO AMPLIFIER WITH DIGITAL AUDIO AND VOLUME INPUTS

[76] Inventors: Manjirnath A. Chatterjee, 314-K Vairo Blvd., State College, Pa. 16803; Gregory R. Simon, 415 West College Ave. Apt. 707, State College, Pa. 16801

[21] Appl. No.: 08/754,212

[22] Filed: Nov. 20, 1996

[51] Int. Cl.⁶ .................. H03F 3/217; H03G 3/10
[52] U.S. Cl. .................. 330/251; 330/297; 330/285
[58] Field of Search .................. 330/251, 279, 330/285, 297; 381/104, 109, 120

[56] References Cited

U.S. PATENT DOCUMENTS

| | | | |
|---|---|---|---|
| 3,629,616 | 12/1971 | Walker | 330/10 X |
| 4,079,334 | 3/1978 | Hamilton | 330/279 |
| 4,178,556 | 12/1979 | Attwood | 330/10 |
| 4,507,619 | 3/1985 | Dijkstra et al. | 330/297 |
| 4,797,633 | 1/1989 | Humphrey | 330/297 |
| 4,873,493 | 10/1989 | Fujiwara | 330/285 |
| 5,352,986 | 10/1994 | Modgil et al. | 330/10 |
| 5,396,194 | 3/1995 | Williamson et al. | 330/297 |
| 5,398,003 | 3/1995 | Heyl et al. | 330/251 X |
| 5,410,592 | 4/1995 | Wagner et al. | 330/251 X |
| 5,424,684 | 6/1995 | Nishioka et al. | 330/297 X |
| 5,442,317 | 8/1995 | Stengel | 330/297 X |
| 5,450,036 | 9/1995 | Nishioka et al. | 330/297 X |
| 5,450,037 | 9/1995 | Kanaya et al. | 330/247 |
| 5,479,134 | 12/1995 | Nishioka et al. | 330/297 X |
| 5,483,197 | 1/1996 | Nishioka et al. | 330/297 X |
| 5,508,658 | 4/1996 | Nishioka et al. | 330/297 X |

*Primary Examiner*—Steven J. Mottola

[57] ABSTRACT

An audio amplifier with a digital input bus for both audio (48) and volume (47) level inputs is disclosed. Volume control is achieved by maintaining dynamic voltage supply rails (43) and (44) to an audio output controller block (45) at a fixed ratio of the maximum available supply voltages (40) and (41). This is accomplished by a volume level controller block (42). The audio output controller block accepts digital samples and converts the samples to analog voltages within the range of the volume rail voltages for the purpose of driving a audio frequency loudspeaker (46). Such a system has very high efficiency when compared with older Class A and AB designs and improves the ease of implementation of volume control over Class D designs. The system is easily distinguished from other designs using variable rail voltages because prior art designs used the rail voltage to track the audio output. The present invention varies the rail voltages for the purpose of controlling the volume of the output and as such relatively large voltages may exist between the output and the voltage supply rails. Also the present invention makes use of all digital inputs whereas prior art does not.

3 Claims, 9 Drawing Sheets

HIGH POWER EFFICIENCY AUDIO AMPLIFIER WITH DIGITAL AUDIO AND VOLUME INPUTS

BACKGROUND

1. Field of Invention

This invention relates to high power efficiency audio amplifiers which have digital input and built in digital volume control.

2. Description of Prior Art

Prior art amplifier designs rely on Class-A, Class-AB (hybrid), or more recently, Class-D, Class-G, and Class-H, output stages to deliver high power to a speaker. In Class-A designs the output devices are biased into their most linear conductivity region. This allows for nearly perfect reproduction of the audio signal. However, a great price is to be paid in power efficiency. This is due to the fact that large DC bias currents flow constantly through the output devices resulting in continuous heat dissipation. Class-B amplifiers have higher efficiency than Class-A amplifiers at the expense of crossover distortion. This can be overcome by applying a small bias current to the output stage and thus create a hybrid output stage known as a Class-AB output stage. Class-AB output stages have nearly linear output and much improved power efficiency over Class-A designs.

Class-D amplifiers are rarely and only recently used for audio purposes. The most common use is for driving large power inductive loads such as synchronous motors and inverters. In Class-D amplifiers the output devices do not operate in their linear mode. Instead, these devices use pulse width modulation, where the duty cycle is modulated proportional to the amplitude of the input signal. Fourier analysis shows that the spectral output of this type of amplifier contains sine terms at the switching frequency and above and subharmonics representing the input signal. In order to use this type of amplifier the switching frequency terms are filtered away with a low pass (generally L-C type) filter. A Class-D amplifier can be implemented in a straight forward manner with analog circuits such as with a triangle wave generator, comparator, and high power output transistors as is shown in prior art. Class-G and Class-H amplifiers use variable tracking power supply rails in conjunction with Class-A, or Class-AB, output stages to achieve higher power efficiency then Class-A or Class-AB designs alone.

Disadvantages of the prior art include:

Pure Class-A designs are very power inefficient. To deliver high power to the load, the output stages may dissipate much greater than 50% of the total available power.

Pure Class-B designs have crossover distortion and are rarely employed for audio.

Class-AB designs improve on the power inefficiency of Class-A and the crossover distortion of Class-B, but are not as power efficient as the present invention.

Pure Class-D designs have not been employed for audio because of their poor frequency response and difficulty with unwanted harmonic generation.

Class BD, Class C, or class H designs may include variable rail voltages that track the desired output but do not offer the inherent volume control configuration of the present invention. The present invention's rail voltages are used for volume control not for tracking the desired audio output signal.

Prior art cited does not make use of digital methods for generating PWM waveforms for use in audio amplifiers or in volume control.

The following U.S. Pat. Nos. 5,450,036, 5,424,684, 5,483,197, 5,508,658, 5,479,134, explicitly claim the use of an analog triangle wave, and comparator based techniques for PWM generation. U.S. Pat. Nos. 3,629,616 claims sawtooth wave for generation of PWM instead of triangle wave generation. U.S. Pat. No. 5,450,037 uses gradient detection to track the power supply rails to the output voltage. U.S. Pat. No. 5,442,317 discloses a switching power supply which tracks the audio output, but in this patent the supply voltage is independent of the volume level setting. U.S. Pat. Nos. 5,396,194 and 4,507,619 disclose exemplary example of a class BD audio amplifier with a fully tracking power supply system where the audio output is followed by a switching power supply and then reproduced by a linear output stage. U.S. Pat. No. 5,410,592 discloses a purely class D audio amplifier with a fixed design state variable feedback loop controller. U.S. Pat. No. 5,352,986 claims a 3rd or higher order control system for maintaining a desired voltage output at the load of a switching amplifier. U.S. Pat. No. 4,178,556 discloses an analog trap resonant filter on the output of a switching amplifier for removing the fundamental switching frequency from the output. U.S. Pat. No. 4,797,633 describes a staggered stage amplifier that uses peak detection to activate multiple stages, with each stage operating in linear mode.

OBJECTS AND ADVANTAGES

The present has four main advantages. These advantages are:

(a) very high power efficiency, (b) built-in volume control in the power electronics, (c) entire circuit can be viewed as digitally controlled analog multiplier circuit, and (d) digital inputs and control units which allow the use of digital domain control and filtering techniques.

The power efficiency stems from semiconductor devices being used in their switching or nonlinear mode. This means that the amplifier is a type of class D amplifier with modifications to its supply voltage rails. The volume control of other amplifiers is based upon electronic potentiometers or digital potentiometers. However, these solutions introduce analog control which cannot deliver the performance of linear phase filters. The use digital filters in the present invention allows nonclassical digital filters to be implemented that can remove noise in the input or output or even to allow the system to perform graphic equalization at no extra cost.

Still further objects and advantages will become apparent from a consideration of the ensuing drawings and functional description.

DRAWING FIGURES

REFERENCE NUMERALS OF FIGS. 1–10

Figure 3:
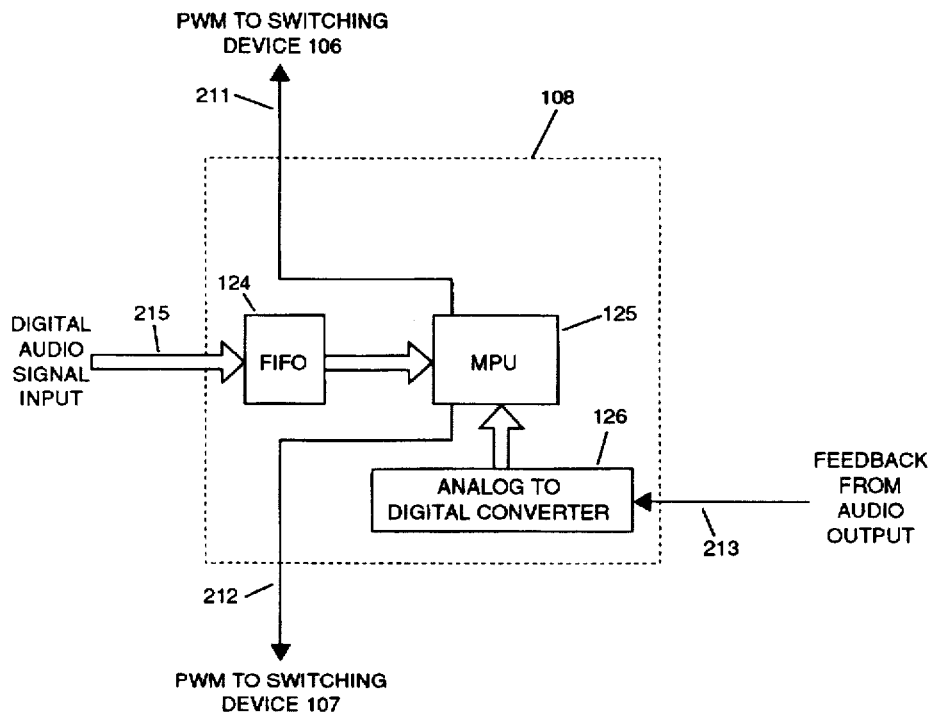
FIG. 3 is a detailed view of the audio output controller for the dual polarity implementation of the invention shown in FIG. 1.
Figure 5:
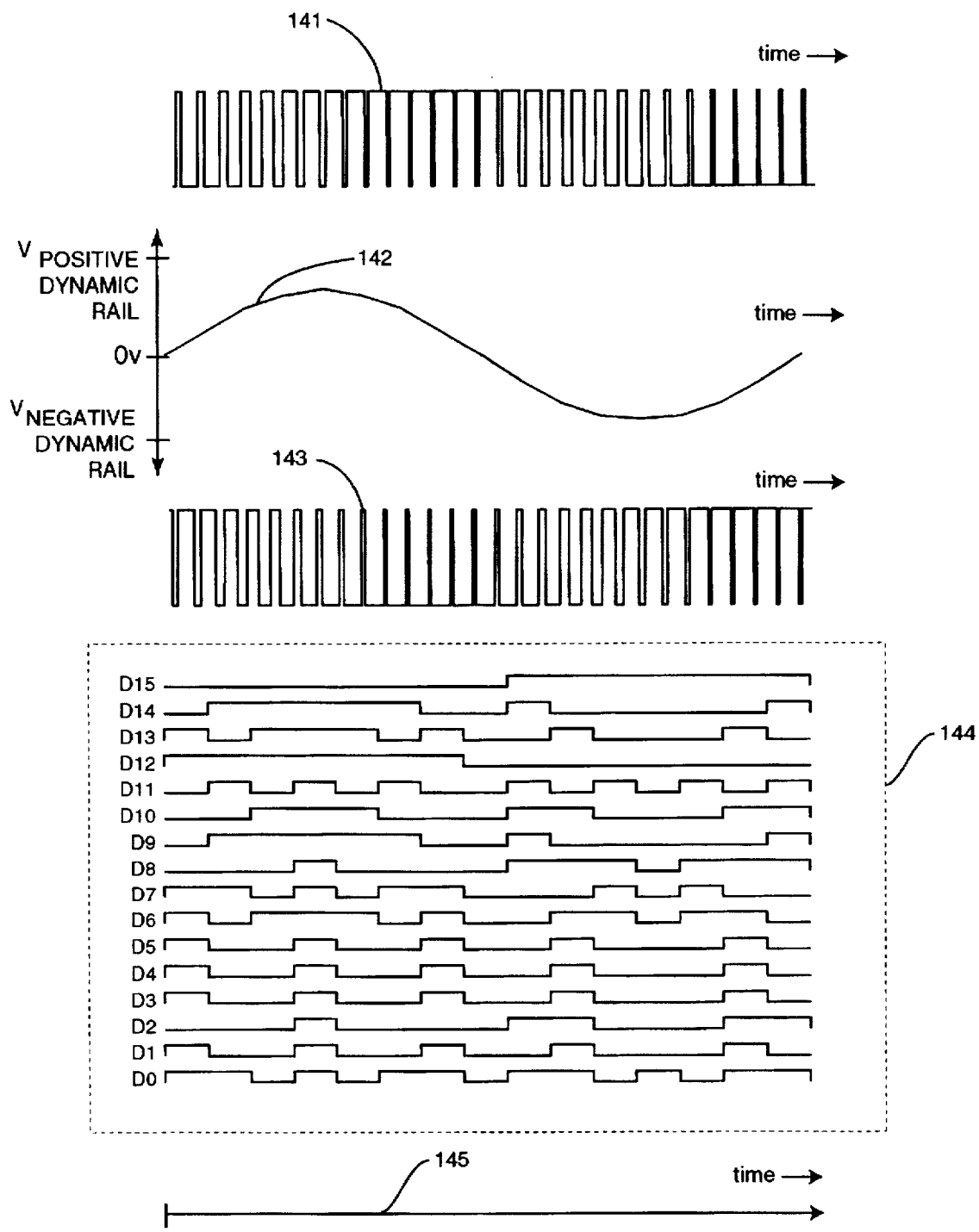
FIG. 5 shows waveforms of signals present in the system relating to the audio output controller of FIG. 3.
Figure 9:
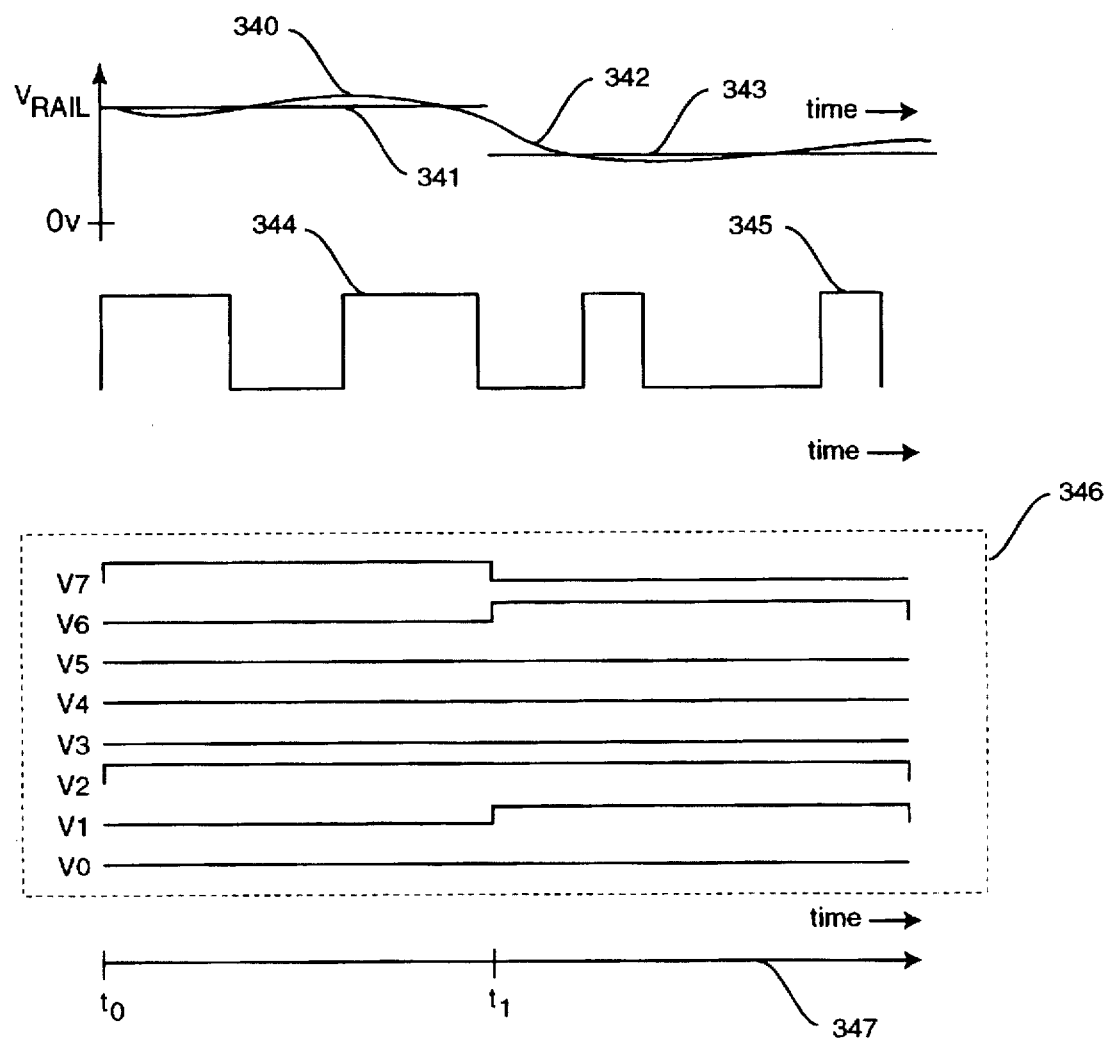
FIG. 9 shows waveforms of the signals present in the system relating to the volume controller of FIG. 7.
Figure 10:
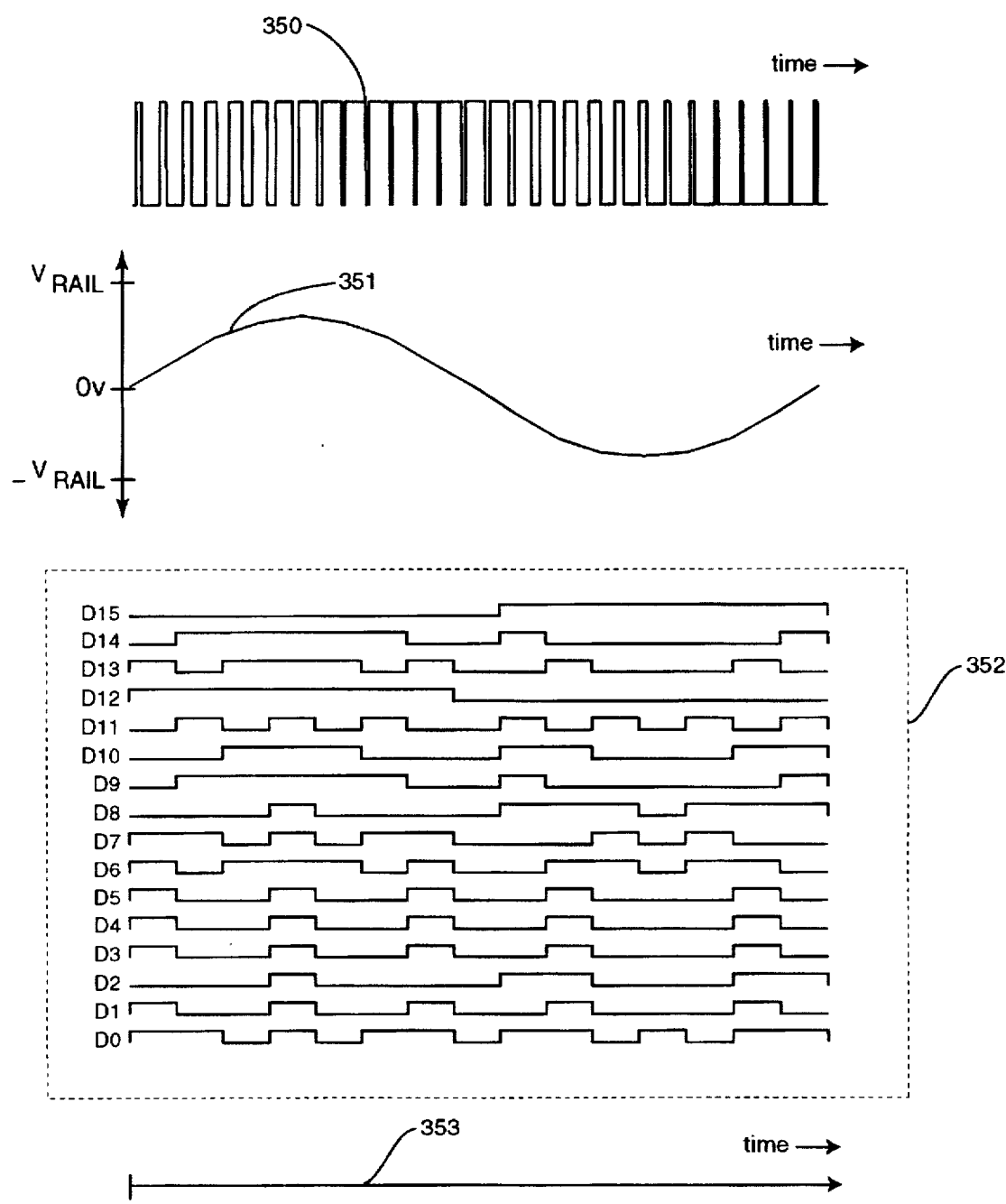
FIG. 10 shows the waveforms of the signals present in the system relating to the audio controller of FIG. 8.

100 DC Power Bus
101 semiconductor switching device
102 passive lowpass filter
103 semiconductor switching device
104 passive lowpass filter
105 volume level controller
106 semiconductor switching device
107 semiconductor switching device
108 audio output controller
109 passive lowpass filter
110 audio frequency loudspeaker
121 Micro Processor Unit (MPU)
122 analog to digital converter
123 analog to digital converter
124 FIFO (First-In First-Out) buffer
125 Micro Processor Unit (MPU)
126 analog to digital converter
127 positive dynamic voltage rail (t0<time<t1)
128 positive dynamic voltage rail (time>t1)
129 desired positive dynamic voltage rail (time>t1)
130 desired positive dynamic voltage rail (t0<time<t1)
131 control signal for positive dynamic voltage rail (t0<time<t1)
132 control signal for positive dynamic voltage rail (time>t1)
133 control signal for negative dynamic voltage rail (t0<time<t1)
134 control signal for negative dynamic voltage rail (time>t1)
135 negative dynamic voltage rail (t0<time<t1)
136 desired negative dynamic voltage rail (time>t1)
137 negative dynamic voltage rail (time>t1)
138 desired negative dynamic voltage rail (t0<time<t1)
139 volume level input (8-bit bus implementation)
140 time axis for FIG. 3
141 control signal for switching device 106
142 filtered amplified audio output
143 control signal for switching device 107
144 digital audio input samples (16-bit bus implementation)
145 time axis for FIG. 5
200 positive DC rail
201 negative DC rail
202 positive dynamic voltage rail
203 negative dynamic voltage rail
204 unfiltered amplified output
206 lowpass filtered amplified output
207 control signal for positive dynamic voltage rail
208 control signal for negative dynamic voltage rail
209 feedback from positive dynamic voltage rail
210 feedback from negative dynamic voltage rail
211 control signal for audio output #1
212 control signal for audio output #2
213 feedback from audio output
214 digital volume level input
215 digital audio signal input
300 DC power bus
302 volume level controller
304 semiconductor switching device
306 passive lowpass filter
308 passive lowpass filter
310 audio output controller
312 audio frequency loudspeaker
314 semiconductor switching device
315 semiconductor switching device
316 semiconductor switching device
317 semiconductor switching device
320 analog to digital converter
322 Microprocessor Unit (MPU)
324 FIFO (First-In First-Out) buffer
325 digital bus from FIFO 324 to MPU 326
326 Microprocessor Unit (MPU)
328 analog to digital converter
329 digital bus
330 difference amplifier
331 analog connection from difference amplifier 330 to analog to digital converter 328
340 dynamic voltage rail (t0<time<t1)
341 desired dynamic voltage rail (t0<time<t1)
342 dynamic voltage rail (time>t1)
43 desired dynamic voltage rail (time>t1)
344 control signal (t0<time<t1)
345 control signal (time>t1)
345 digital volume level input bus
347 time axis for FIG. 9
350 PWM switching waveform
351 filtered amplified audio output waveform
352 digital audio input bus
353 time axis for FIG. 10
380 volume level controller block
390 audio output controller block
400 DC positive rail voltage
401 DC negative rail voltage (ground)
402 dynamic voltage rail
403 ground
404 digital volume level input
405 digital bus from analog to digital converter 320 to MPU 322
406 control signal for dynamic voltage rail
408 feedback from dynamic rail
410 feedback from output #2
412 feedback from output #1
418 control signal to semiconductor switching device 314
419 control signal to semiconductor switching device 315
420 control signal to semiconductor switching device 316
421 control signal to semiconductor switching device 317
424 digital audio signal input

DESCRIPTION-FIGS. 1–10

Figure 1:
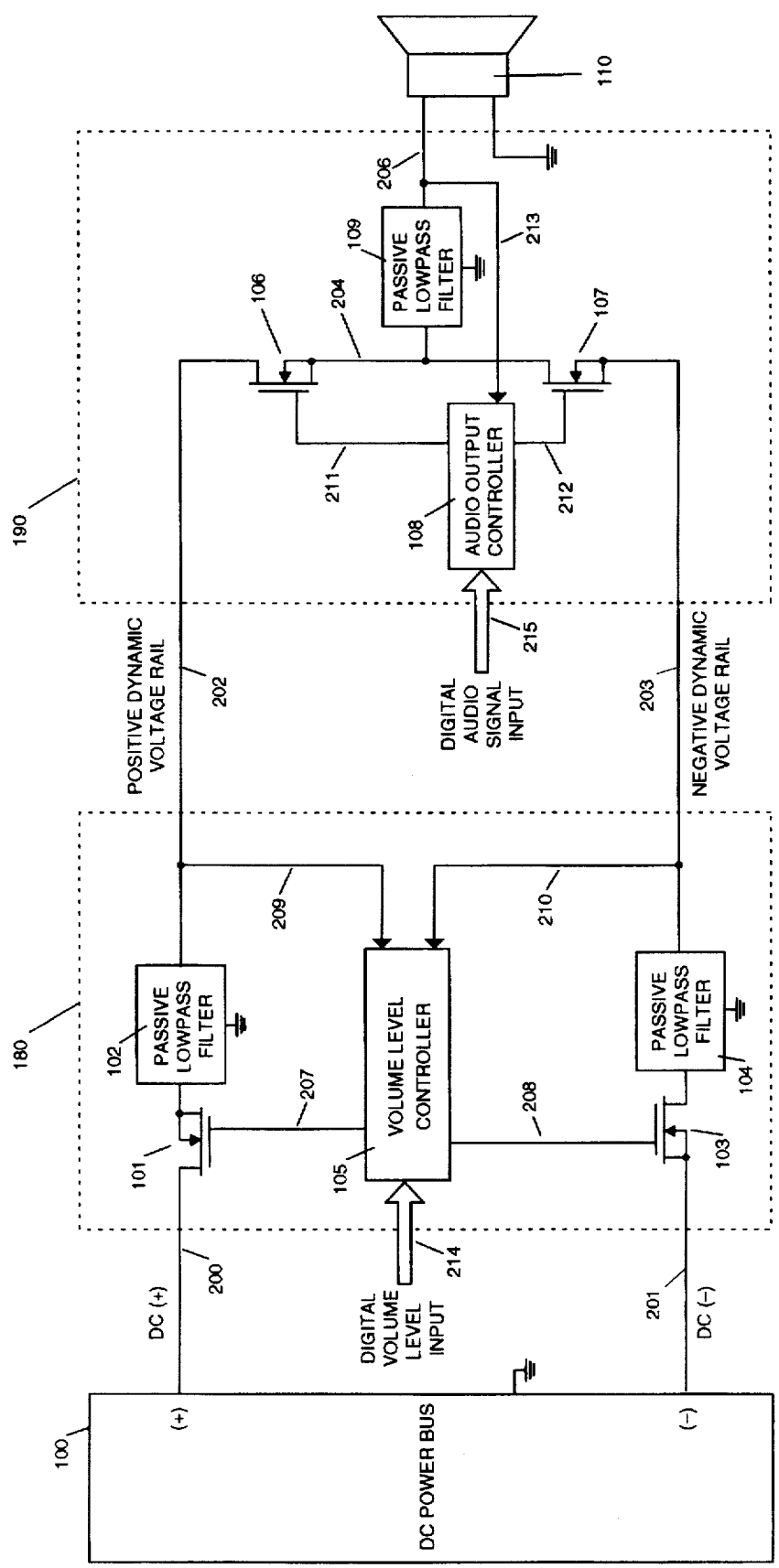
FIG. 1 shows an example of implementation for the audio amplifier system using a dual polarity voltage supply with ground.

A typical embodiment of the audio amplifier system of the present invention is shown in FIG. 1 using a dual polarity power supply. The system has a DC power bus 100 which supplies positive and negative voltages referenced to a common ground. This DC power bus serves as an upper limit on the positive voltage rail 200, and a lower limit on the negative voltage rail 201 for the system.

The positive output of a DC power bus 100 is connected to a semiconductor switching device 101 via path 200. The negative output of the DC power bus 100 is connected to a semiconductor switching device 103 via path 201. The digital volume level input 214 is applied to the system through a digital interface. This digital interface is connected to a volume level controller 105 The volume level controller 105 is connected to switching device 101 via path 207 and switching device 103 via path 208.

The switching device 101 is connected to a passive lowpass filter 102. The output of the lowpass filter 102 is connected in feedback to a volume controller 105 via path 209. Path 202 is a positive dynamic voltage rail.

The switching device 103 is connected to a passive lowpass filter 104. The output of the lowpass filter 103 is connected in feedback to the volume controller 105 via path 210. Path 203 is a negative dynamic voltage rail.

A digital audio signal input 215 is applied to the system in the form of digital words (audio samples) through a digital data interface. An audio output controller 108 is connected to switching device 106 and switching device 107 via paths 211 and path 212, respectively. Switching elements 106 and 107 are shorted and connected to a passive lowpass filter 109. The passive lowpass filter 109 is connected to the audio output controller 108 through feedback path 213. The output of the passive lowpass filter 109 is connected to an audio frequency loudspeaker 110 via path 206. The other terminal of the audio frequency loudspeaker is also connected to ground.

Figure 2:
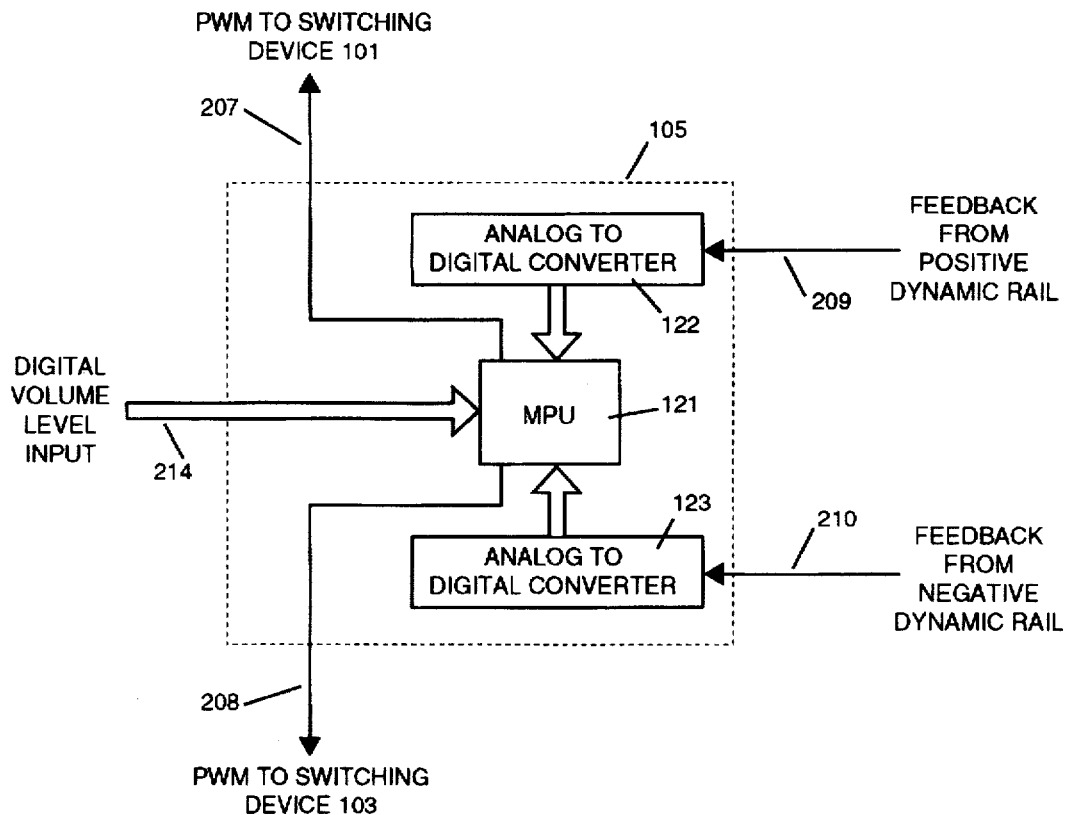
FIG. 2 is a detailed view of the volume level controller for the dual polarity implementation of the invention shown in FIG. 1.

FIG. 2 shows an enhanced view of the digital volume level controller 105. Input to the volume level controller is in the form of a digital word through digital volume level input 214, which is stored in a register of a micro processor unit (MPU) 121. The MPU 121 generates a positive control signal 207 which is connected to switching device 101. The MPU 121 generates a control signal 208 connected to switching device 103. Feedback path 209 from the positive dynamic voltage rail 202 is connected to an analog to digital converter 122. The digital output of the analog to digital converter 122 is connected to MPU 121. Feedback path 210 from the negative dynamic voltage rail 203 is connected to an analog to digital converter 123. The digital output of the analog to digital converter 123 is connected to MPU 121.

FIG. 3 shows an enhanced view of the audio output controller 108. The digital audio signal input 215 is buffered by a digital FIFO 124 (First-In First-Out) buffer. The output of the FIFO buffer 124 is connected to microprocessor unit (MPU) 125. The MPU 125 generates control signals 211 and 212 connected to switching devices 106 and 107, respectively. Feedback path 213 from the output of the passive lowpass filter 109 is connected to an analog to digital converter 126. The digital output of the analog to digital converter 126 is connected to MPU 125.

Figure 4:
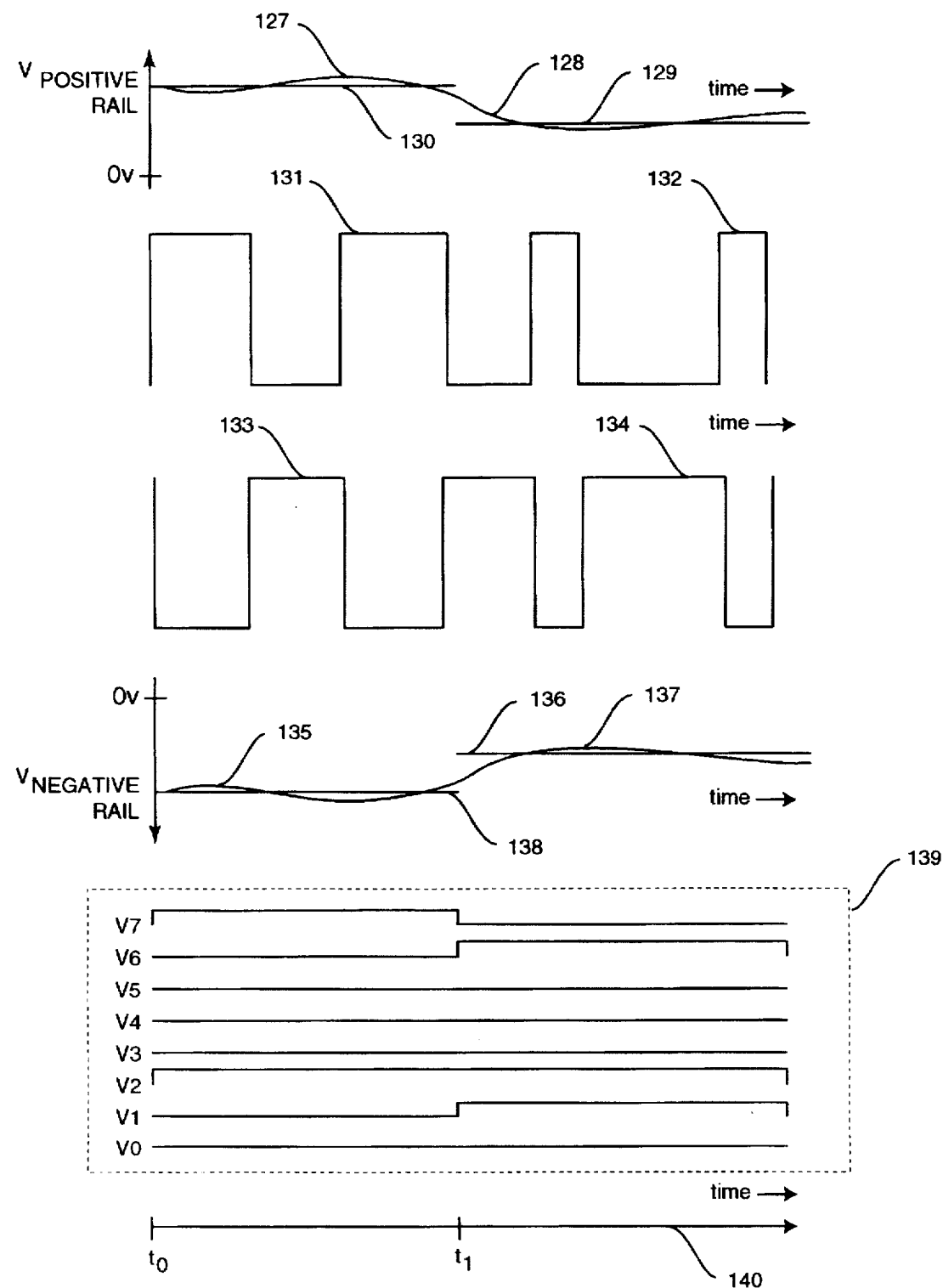
FIG. 4 shows waveforms of signals present in the system relating to the volume level controller of FIG. 2.

FIG. 4 illustrates various signals present in volume controller block 180. FIG. 4 uses 8 bits for digital bus 214, although this number of bits is used only to facilitate explanation and operation of the system. Each bit of the bus is noted by "V" followed by the bit number of the bus. All the plots in FIG. 4 have time as a horizontal axis, noted by axis 140. An 8 bit bus 139 shows the logic states of the volume at two different times (t0 and t1 on axis 140). Control signals generated from these logic states are shown in 131, 132, 133 and 134. The control signal for the upper dynamic voltage rail is shown by 131 and 132. The control signal for the lower dynamic voltage rail is shown by 133 and 134. The desired upper voltage dynamic voltage rail is given by curves 130 and 129, which represent a change in rail potential at time=t1. The desired lower voltage dynamic voltage rail is given by 138 and 136, which represent a change in rail potential at time=t1. Finally, the actual rail potential is shown in various states by 127 and 128 for the upper rail, and 135 and 137 for the lower rail.

FIG. 5 shows various signals related to an audio output controller block 190. All the graphs in FIG. 5 have time as a horizontal axis, denoted by the time axis 145. FIG. 5 uses 16 bits for digital bus 215, although this is simply to facilitate explanation and operation of the system. Each bit of the bus is noted by "D" followed by the bit number of the bus. Digital samples of a sinusoid are applied to bus 215 shown by waveforms 144. Two control signals 141 and 143 are derived from digital audio waveforms 144. Control signal 141 is the waveform present at path 211. Control signal 143 is the waveform present at path 212. An analog voltage 142 is bounded by the voltage of the rails.

Figure 6:
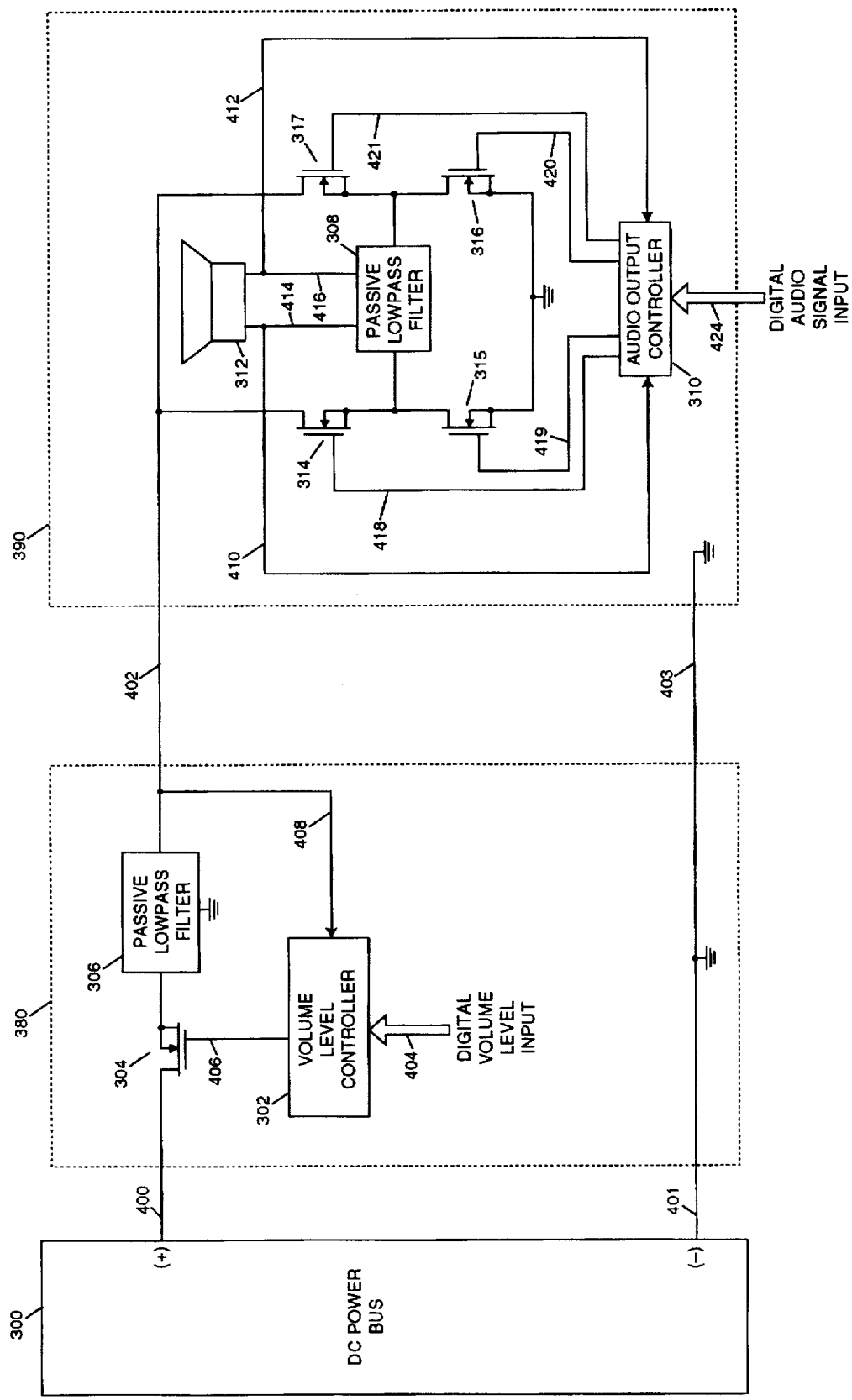
FIG. 6 shows the invention implemented with single polarity voltage supply.

A second embodiment of the present invention is illustrated by FIGS. 6–10. The embodiment illustrated by FIGS. 6–10 uses a single polarity DC power supply. FIG. 6 shows a DC power bus 300 providing a fixed positive voltage rail 400 and a reference 401. The positive voltage of DC power bus 300 is connected to a semiconductor switching device 304. A volume level controller 302 receives a digital volume level input 404. The volume level controller is connected to the semiconductor switching device 304 via path 406. The output of semiconductor switching device 304 is connected to a lowpass filter 306. The output of the lowpass filter 306 is a dynamic voltage rail 402. The dynamic voltage rail is fed back to the volume level controller 302 through path 408.

An audio output controller 310 is connected to four semiconductor switching devices 314, 315, 316, and 317. Dynamic voltage rail 402 is connected to switching devices 314 and 317. Switching devices 314, 315, 316, and 317 are connected to a lowpass filter 308. The lowpass filter 308 is connected to an audio frequency loudspeaker 312. The outputs of lowpass filter 308 are represented by paths 414 and 416. Feedback paths 410 and 412 are connected from the outputs of lowpass filter 308 to the audio output controller 310. Digital audio signal input 424 is connected to the audio output controller 310.

Figure 7:
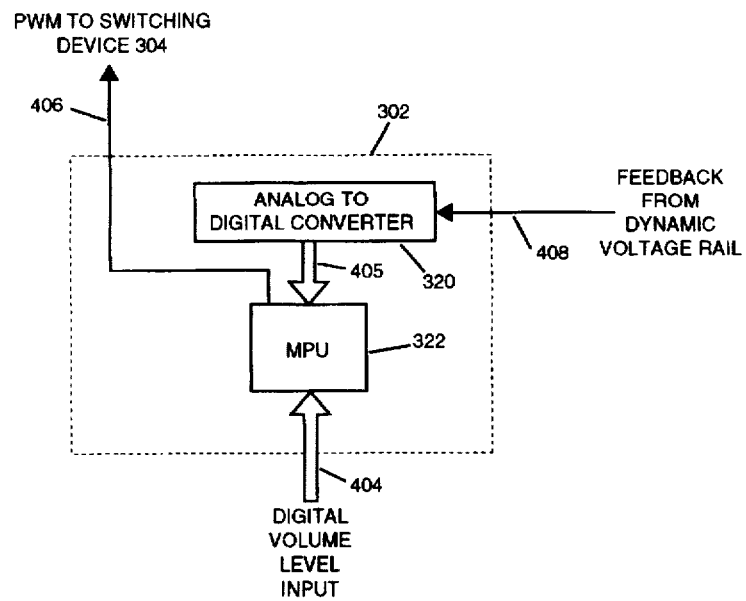
FIG. 7 is a detailed view of the volume controller for the single polarity voltage supply implementation shown in FIG. 6.

FIG. 7 shows an enhanced view of the volume level controller 302. The digital volume level input 404 is connected to a micro processor unit (MPU) 322. Feedback from dynamic voltage rail 408 is connected to an analog to digital converter 320. The analog to digital converter 320 is connected via a digital connection 405 to the MPU 322. The MPU 322 generates a control signal 406.

Figure 8:
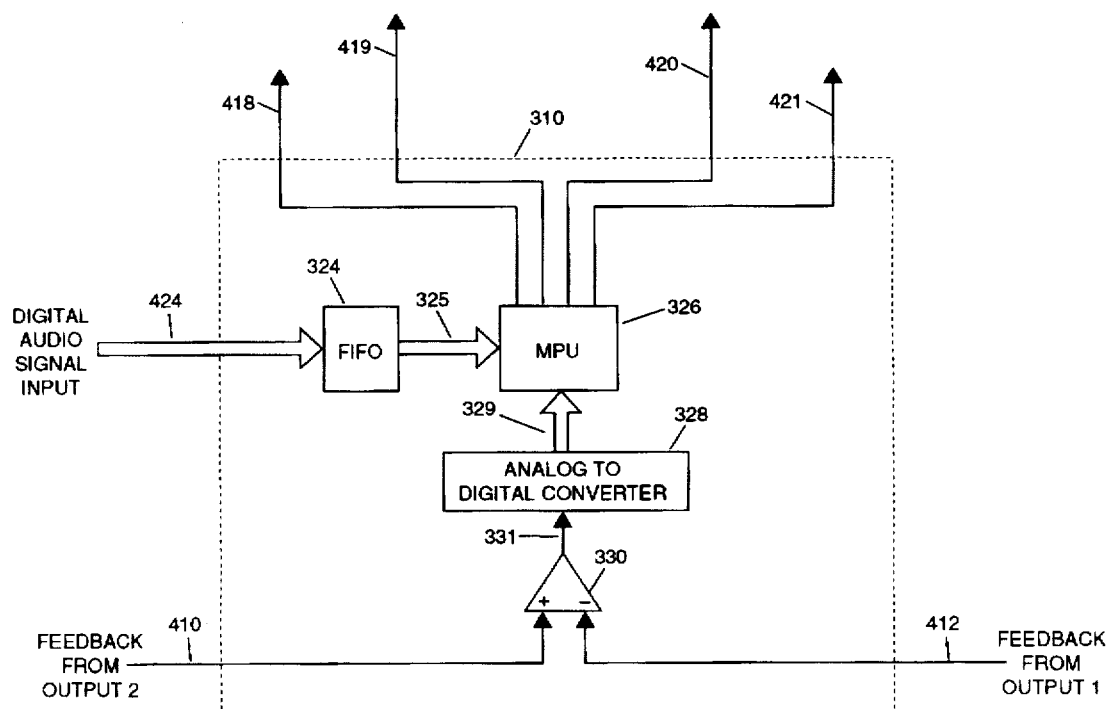
FIG. 8 is a detailed view of the audio output controller for the single supply implementation.

FIG. 8 is an enhanced view of the audio output controller 310. The digital audio signal input 424 is connected to a First In First Out (FIFO) buffer 324. A digital connection 325 connects FIFO 324 to a microprocessor unit (MPU) 326. Feedback from amplified filtered output #1 412 is connected to a difference amplifier 330. Feedback from amplified filtered output #2 410 is connected to difference amplifier 330. The output of difference amplifier 330 is connected to analog to digital converter 328 via analog connection 331. The output of the analog to digital converter 329 is connected to the MPU 326. The MPU 326 generates four control signals 418, 419, 420, and 421.

FIG. 9 illustrates time-varying waveforms present in the volume level controller block 380. All plots in FIG. 9 share a common time axis 347, which contains two time states t0 and t1. The desired voltage potential of the dynamic voltage rail is shown by 341 for (t0<time<t1) and 343 for (time>t1). The actual potential of the dynamic voltage rail is shown by 340 for (t0<time<t1) and 342 for (time>t1). A control signal to generate the voltage rail is shown by 344 and 345. A digital 8-bit bus 346 shows logic states for a changing volume.

FIG. 10 illustrates time-varying waveforms present in the audio output controller block 390. All plots in FIG. 10 share a common time axis 353. A control signal 350 is shown. A 16-bit digital bus 352 represents audio samples. A continuous voltage 351 represents the amplified filtered audio output.

Figure 11:
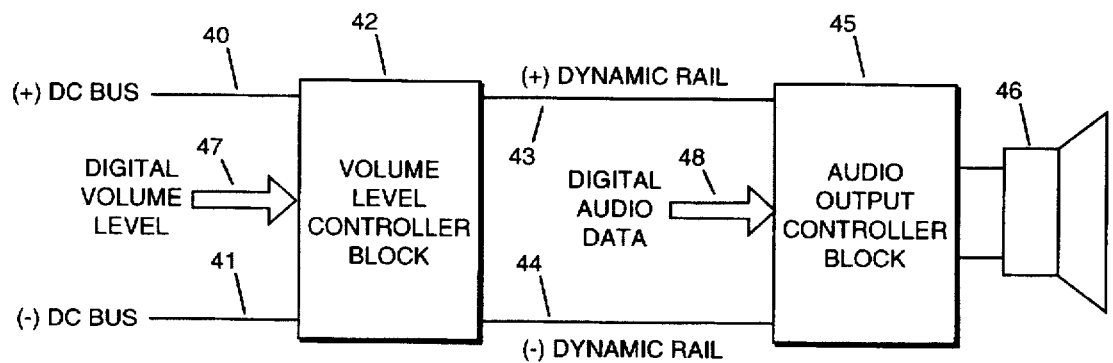
FIG. 11 shows overview of the amplification system.

FIG. 11 shows an overview of the amplification system. A fixed power source (40, 41) is connected to the volume level controller block 42. The desired volume level 47 is input to the volume controller 42. The output of volume level controller block 42 is two dynamic voltage rails (43, 44) and connected to audio output controller block 45. Digital audio data 48 enters the amplification system and is output at the audio frequency loudspeaker 46.

First Embodiment

Operation-FIGS. 1–5

The first embodiment of the present invention operates as three independent parts when configured to run from dual supply voltages. The first part is the power input to the system 100 and consists only of the parts required to supply power to the system. The second part is the volume level controller block 180 including positive dynamic voltage rail 202 and negative dynamic voltage rail 203. The third part of the system is the audio output controller block 190.

In the first part of the system shown in FIG. 1 the DC Power Bus 100 is responsible for supplying approximately fixed rail voltages to the volume stage. This can be accomplished via batteries, an AC line transformer with a rectifier and a filter, or a switching converter. The DC Power bus 100 should be capable of at least maintaining a voltage at positive reference rail and negative reference rail above the maximum desired positive dynamic voltage rail 202 and desired negative dynamic voltage rail 203 at all times. This allows the volume level controller to operate properly at all times.

The second section of the system consists of the volume level control circuitry. The volume level controller reads a digital word from the digital volume level input 214, which represents the desired volume level on a scale of 0 to 255. After receiving a volume level input the volume controller 105 attempts to maintain the percentage of the DC bus rails at the volume rail outputs 202 and 203 (note that the dynamic voltage rails 202 and 203 have equal voltage magnitudes but opposite signs).

The volume level controller attempts to regulate the dynamic voltage rails 202 and 203 by sending control signals 207 and 208 to switching devices 101 and 103, respectively. Devices 101 and 103 are not to operate in their linear conductive modes, but in their switching or nonlinear modes. This allows high efficiency because almost all of the power dissipated in these devices stems from the brief transients that occur as the devices change states. This implies that some method of pulse modulation is required to achieve regulation of the rail voltages 202 and 203. As such, the volume level controller sends pulse width modulated (PWM) control signals down paths 207 and 208 and the switching devices 101 and 102 switch on and off respectively with these signals. Since the voltage supply to the audio output stage must he supplied with a linear and constant voltage supply, a passive lowpass filter is put between the switching devices 101 and 103 and their respective rail voltage outputs 202 and 203. Feedback signals 209 and 210 are returned from the dynamic voltage rails 202 and 203 to the volume controller 105. This allows the controller to adjust the switching signals 207 and 208 to keep the dynamic rail voltages 202 and 203 at the levels set by the volume level input 214.

The audio output controller block works in a similar manner to the volume level controller block. The audio output controller block is represented by group 190. The audio output controller 108 receives data from the digital audio signal input 215. This signal input comes in the form of digital words in a similar manner to the data for the volume control circuitry. However, the audio data is much more rapidly changing then the volume data and it is of higher resolution. After receiving the audio word the controller outputs a direct translation of the control word along paths 211 and 212 to devices 106 and 107. These devices also operate in a nonlinear PWM switching mode similar to devices 101 and 103. This creates a high power PWM representation of the signal at 204. The high power PWM signal is then filtered by nonresistive lowpass filter 109, before being output to an audio frequency loudspeaker 110. A feedback signal 213 to the audio output controller 108 allows the audio output controller to maintain the desired audio output level. This demonstrates that the entire audio output controller block circuitry becomes a high power digital to analog converter.

The volume level controller 105 insures that the actual dynamic rail voltages match the desired rail voltage (voltage that has been input via the digital input 214). An enlarged view of the controller's internal components are shown in FIG. 2. In order to control the rail voltages the controller samples actual rail voltages at 202 and 203 via the feedback signals 209 and 210, respectively. These feedback signals are digitized by analog to digital converters 122 and 123. The digital outputs from the analog to digital converters are fed to a microprocessor unit (MPU) 121 to allow digital manipulation of the measured rail voltages. The MPU 121 can then implement in software or firmware control loops, including fuzzy, PID, or other control algorithms. The MPU 121 then adjusts the pulse with modulation control signals 207 and 208 to control the switching devices 101 and 103. It is important to realize that the control signals and PWM outputs for the positive and negative rail are not necessarily identical or synchronized due to fluctuations in the load (audio output stage circuitry). They are merged here for ease of illustration.

The audio output controller 108 functions in a similar manner to the volume level controller 105. The components internal to the audio output controller are shown in FIG. 3. A digital audio signal input 215 is received into a FIFO buffer 124. This FIFO buffer allows the digital audio signal input to be unsynchronized with audio output. This allows a burst of audio samples to be written to the FIFO buffer. The audio sample data is clocked out at a fixed rate to a MPU 125. As each sample is clocked out of the FIFO buffer, the MPU 125 outputs pulse width modulation signals on paths 211 and 212 to control switching devices 106 and 107 in the main diagram. The MPU 125 also receives a feedback signal 213 from the audio output filter stage. This feedback signal is digitized by an analog to digital converter 126. This converter translates the analog audio output voltage into a digital representation for analysis by the MPU 125. The MPU 125 then runs control algorithms to insure that the actual output voltage matches the input data sample that has been clocked out of the FIFO buffer.

The volume level controller block 180 can be fully explained as a separate system as is shown in FIG. 4. A digital bus 139 representing the desired volume level is shown for an eight bit implementation of the volume level controller. In the time period from t0 to t1 on the time axis 140 the digital value of the volume input is seen to be 10000100 in binary. This corresponds to a value of 132 in decimal. The controller then attempts to maintain the volume at $^{132}/_{255}$ of the maximum available volume level. Due to the logarithmic nature of human hearing sensitivity, a logarithmic volume mapping would normally be used. At this time period the positive rail is actually at the value shown by waveform 127. This is compared with the desired value 130. The slight difference results from two factors. There exists a small time lag while the volume level controller compensates for changes in the load. In addition, the passive filter 102 in cannot remove all of the harmonics caused by the switching nature of device 101. The switching waveform 131 travels along path 207 to device 101. The actual negative rail voltage 135 and the desired rail voltage 138 can be seen as the mirror of the positive rail voltage. The only difference being the negative polarity. The switching waveform being transmitted to device 103 via path 208 is shown in FIGURE 133. At time t1 on the time axis 140 the volume command changes. The new volume level is seen in the interval from t1 to the right on volume data bus 139. The bits now read 01000110 (binary). This is the same as 69 in decimal which means that the volume level controller is attempting to maintain a volume level of $^{69}/_{255}$ of the maximum rail voltage. The desired positive rail voltage drops to the lower level 129. The actual positive rail voltage is represented by 128 in this time interval. The switching waveform in this period is 132. The smaller duty cycle of the PWM waveform 132 corresponds to less voltage as seen in 128 and 129. The desired negative rail voltage 136 and the actual rail voltage 137 change in the same fashion as the positive rail voltages. The only difference is the polarity of the rails. The switching waveform for the negative rail in this time period is seen as waveform 134. This waveform is transmitted to device 103.

The waveforms from the audio output controller and the actual audio output can be seen in FIG. 5. The audio output controller receives digital input data in a similar manner to that for the volume level controller. The implementation shown here is for an output resolution of 16 bits. Time moves to the right of the figure along axis 145, audio data is fed along path 215 to the audio output controller 108 at regular intervals. This is seen as the digital data bus 144. Here the data represents a sinewave to facilitate explanation. The audio output controller then sends pulse width modulation (PWM) switching signals 141 and 143 to devices 106 and 107, respectively. These switching waveforms cause the potential 204 to switch potential between rail voltage 202 and rail voltage 203. This waveform is then lowpass-filtered to produce the actual output as seen by waveform 142. This waveform represents the true analog output of the system.

Second Embodiment

Operation of FIGS. 6–10

FIGS. 6–10 depict the present invention when configured for use with a single polarity DC power bus. The system contains a DC power bus 300 which contains a positive rail voltage and a negative rail voltage which is referenced to ground. The voltage level measured from 400 to 401 represents the maximum amplitude that can be delivered at the output. The volume level controller block 380 is different from the volume level controller block of the first embodiment 180 because of the different DC power bus. The need for controlling two voltage rails to achieve volume control is eliminated with a single polarity DC power bus. This is because the total voltage supplied to the audio circuitry is only a function of the positive dynamic rail voltage 402 relative to ground 401. This voltage is controlled by the volume level controller 302 which sends a PWM waveform along path 406 to switching device 304. The output of device 304 is filtered by passive lowpass filter 302 which smooths the switching transients generated by semiconductor switching device 304. A feedback path 408 is provided from the positive rail 402 to allow the volume level controller 302 to insure proper regulation of the dynamic voltage rail 402. In this sense the volume level controller 302 can maintain positive rail 402 at the desired percentage of the DC input voltage 400.

The audio output controller block 390 uses an H bridge consisting of semiconductor switches 314, 315, 316, and 317 to deliver output power. The H bridge is fed by the positive dynamic voltage rail 402 and ground 403. The maximum voltage that can be developed across the load is determined by the magnitude of the voltage from the positive rail 406 and ground 403. The audio output controller 310 receives digital audio signal input 424. The audio output controller then generates a set of complementary PWM signals via paths 418, 419, 420, and 421 to the H bridge semiconductor switches 314, 315, 316, and 317. An audio frequency loudspeaker 312 connected to a lowpass filter 308 via paths 414 and 416. The lowpass filter 308 blocks the PWM switching frequency transients created by the H bridge from reaching the loudspeaker. However, the passive filter does allow audio frequency signals to pass to the loudspeaker with minimal attenuation. The filter 308 uses only standard passive devices such as inductors and capacitors. The audio output controller 310 receives feedback signals 410 and 412 from each side of the loudspeaker 312. The feedback signals enable the audio output controller 310 to measure the actual output voltage and insure that it matches the desired output as determined by the digital audio input 424. The controller adjusts the PWM signals sent to the H bridge to keep the actual output as near as possible to the value specified by the digital input.

The volume level controller 302 is shown in more detail in FIG. 7. The controller 302 receives a digital volume level input 404 which is connected to the volume controller MPU 322. The digital volume level is typically stored in a register of the MPU 322. Feedback from the positive rail is transmitted along path 408 to an analog to digital converter 320. This converter digitizes the dynamic voltage rail so as to make a digital representation of the analog rail voltage. This digital measurement is then transmitted along path 405 to the MPU 322. The MPU 322 then compares the digital input 404 to the measurement sent from the analog to digital converter 320 and makes any adjustments necessary by changing the duty cycle of the PWM signal 406 being sent to semiconductor switching device 304.

The audio output controller 310 is shown in more detail in FIG. 8. The controller receives a digital audio signal input 424 into a FIFO buffer 324. The digital samples are then clocked out at a constant rate along path 325 into MPU 326. The MPU 326 ensures that the actual audio output level across the loudspeaker is closely matched to the digital input word in the following manner. An analog difference amplifier 330 subtracts the voltage at each loudspeaker terminal via feedback paths 410 and 412. This difference voltage is then fed along path 331 to an analog to digital converter 328. The analog to digital converter then converts the difference voltage into a digital word and sends this data to the MPU along path 329. The MPU 326 then modulates the switching signals 418, 419, 420, and 421 that control the H bridge. In this manner the MPU can ensure that the actual audio output matches the desired audio output as determined by the digital input bus.

FIG. 9 depicts typical waveforms from the volume controller block 380. Axis 347 represents time. In the interval from t0 to t1 the digital word 10000100 is present on the digital bus 346. This corresponds to a value of 132 in decimal. This equates to the desired positive rail voltage 341 which can be determined as $132/255$ of the input DC rail voltage. The actual rail voltage 340 is the filtered version of the PWM switching signal 344 in this time period. At time t1 the digital bus changes value to 01000110 (binary). This is 69 in decimal and means that the desired volume level is now $69/255$ of the input DC rail voltage. The desired voltage value during this time period is shown by waveform 343. The actual waveform adjusts gradually as shown by waveform 342. This is a filtered version of the new PWM signal shown by waveform 345.

FIG. 10 shows waveforms present in the audio output controller block 390. Time is represented by axis 353. Time progresses to the right of the page along the time axis 353. Digital data from the audio input bus 352 is converted to a PWM switching waveform 350. This waveform is present at the output of the H bridge but before the lowpass output filter 308. The actual audio output across the speaker is an analog representation of the digital input and is shown as waveform 351. This waveform is smooth in nature because most of the switching harmonics have been reduced by the lowpass filter 308 or by changes in the PWM switching angles by audio output controller 310.

Summary, Ramifications, and Scope

The present invention is an audio power amplifier of very high power efficiency. This is achieved by avoiding dissipating power in resistive elements or semiconductors that are in their operating in their linear mode. The present invention also allows complete electronic control of volume. This allows the user to avoid noisy analog potentiometers which introduce extra noise and mechanically fail with time. It also allows ease of interface to high fidelity digital audio equipment which uses digital interface signals. The use of digital audio inputs allows the audio signal to stay in a highly noise immune digital environment until it is applied to the speaker. This makes the amplifier highly immune to noise injected in the circuit from the power line or even from a user touching the circuit while it is in operation. Also, digital inputs allow the amplifier to be very far away from the sound input source with no increase in distortion. This is because the digital signals can be conditioned to travel long distances without corruption of bits such as at an outdoor concert. An analog line, no matter what, will pick up distortion and noise from the long travel which, in an analog audio amplifier, would be reproduced at the output. Since the controllers are digital in nature, sophisticated filters can be implemented to allow echo cancellation, feedback cancellation, room equalization, linear phase filters, non-classical filters, and other features with no increase in cost.

Note that it is physically impossible to implement noncausal filters with analog components.

The above description of the present invention depicts many specificities but the invention is not limited to these embodiments. These are simply presently preferred embodiments of the invention and others not heretofore discussed may be implemented. Such differences include the use of Bipolar Transistors (BJTs) and Insulated Gate Bipolar Transistors (IGBTs) for the semiconductor switching devices. Other details include the use of H bridge configurations even when a dual polarity DC power bus is used, a half bridge when a single supply is used (this would limit the output to monopolar voltages) and upconverters or boos converters in the volume level input stage so that the invention may be powered from a DC power bus of less voltage than the dynamic volume rail potentials. Different digital methods of generating PWM waveforms including but not limited to digital gate and VLSI implementations rather than a general purpose MPU are simply other embodiments of the present invention.

scope of this invention is determined by the appended claims and the legal equivalents thereto, as opposed to the examples given.

What is claimed:

1. An amplifier system for amplifying an audio signal comprising:

a digitally controlled switching output stage with a digital audio input bus;

a digitally controlled switching volume controller with a digital volume input bus;

at least one voltage rail whose voltage is determined by said digitally controlled switching volume controller.

2. An amplifier system for amplifying an audio signal comprising:

a digitally controlled switching output stage with a digital audio input bus;

a digitally controlled switching volume controller with a digital volume input bus;

at least one voltage rail that does not track said audio signal but is a fixed ratio of the available power supply voltage as determined by said digitally controlled switching volume controller and wherein the ratio is the desired volume level of the amplifier.

3. An amplifier system for amplifying an audio signal comprising at least one voltage rail;

a digitally controlled switching output stage with a digital audio input bus;

a digitally controlled switching volume controller with a digital volume input bus wherein said digitally controlled switching volume controller is directly connected to said digitally controlled switching output stage by said at least one voltage rail.

\* \* \* \* \*